United States Patent
Shiffer et al.

[19]

[11] Patent Number: 6,150,843
[45] Date of Patent: *Nov. 21, 2000

[54] FIVE VOLT TOLERANT I/O BUFFER

[75] Inventors: James D. Shiffer, Pleasanton; Waseem Ahmad, Fremont, both of Calif.

[73] Assignee: VLSI Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/015,328

[22] Filed: Jan. 29, 1998

[51] Int. Cl.[7] ...................... H03K 19/0175; H03K 19/00
[52] U.S. Cl. .................................. 326/80; 326/57; 326/81
[58] Field of Search ................... 326/81, 80, 57, 326/58, 86, 87, 83, 121; 327/534, 546

[56] References Cited

U.S. PATENT DOCUMENTS

| | | | |
|---|---|---|---|
| 4,929,853 | 5/1990 | Kim et al. ................................. | 307/475 |
| 4,963,766 | 10/1990 | Lundberg .................................. | 326/58 |
| 5,004,936 | 4/1991 | Andresen ................................. | 326/87 |
| 5,028,817 | 7/1991 | Patil ........................................ | 307/443 |
| 5,223,751 | 6/1993 | Simmons et al. ........................ | 307/475 |
| 5,338,978 | 8/1994 | Larsen et al. ............................ | 327/534 |
| 5,406,140 | 4/1995 | Wert et al. ............................... | 326/81 |
| 5,410,267 | 4/1995 | Haycock et al. ......................... | 326/81 |
| 5,418,476 | 5/1995 | Strauss .................................... | 326/58 |
| 5,444,397 | 8/1995 | Wong et al. .............................. | 326/81 |
| 5,450,025 | 9/1995 | Shay ........................................ | 326/81 |
| 5,451,889 | 9/1995 | Heim et al. .............................. | 326/81 |
| 5,455,532 | 10/1995 | Bass ......................................... | 327/306 |
| 5,463,330 | 10/1995 | Tsuchida ................................. | 326/81 |
| 5,483,179 | 1/1996 | Dhong et al. ............................ | 326/88 |
| 5,506,535 | 4/1996 | Ratner ..................................... | 327/333 |
| 5,512,844 | 4/1996 | Nakakura et al. ....................... | 326/81 |
| 5,528,447 | 6/1996 | McManus et al. ....................... | 361/91 |
| 5,534,795 | 7/1996 | Wert et al. ............................... | 326/81 |
| 5,543,733 | 8/1996 | Mattos et al. ............................ | 326/81 |
| 5,576,635 | 11/1996 | Partovi et al. ........................... | 326/58 |
| 5,629,634 | 5/1997 | Carl et al. ................................ | 326/58 |
| 5,635,861 | 6/1997 | Chan et al. .............................. | 326/81 |
| 5,748,011 | 5/1998 | Takahashi et al. ....................... | 326/83 |
| 5,764,077 | 6/1998 | Andresen et al. ........................ | 326/83 |

OTHER PUBLICATIONS

Pelgrom, "A 3/5 V Compatible I/O Buffer", *IEEE Journal of Solid–State Circuits*, 30:7, Jul. 1995, pp. 823–825.

Williams, "Mixing 3–V and 5–V Ics", *IEEE Spectrum*, Mar. 1993, pp. 40–42.

*Primary Examiner*—Michael Tokar
*Assistant Examiner*—Daniel D. Chang
*Attorney, Agent, or Firm*—Burns Doane Swecker & Mathis L.L.P.

[57] ABSTRACT

A 5 volt tolerant I/O buffer circuit is coupled to a power supply terminal of a predetermined power supply voltage, for driving an I/O pad to a logic state depending on an input signal and an output enable signal. The I/O buffer circuit minimizes current flow into the power supply terminal when the pad is coupled to a voltage greater than the predetermined power supply voltage. A driver transistor of a first type is formed within a diffusion well and is coupled to the predetermined power supply voltage and to the pad. First and second terminals of a protection transistor are coupled to respective ones of the predetermined power supply voltage and the diffusion well. Circuitry is provided for, when the output enable signal is active, turning on the protection transistor so as to couple the predetermined power supply voltage to the diffusion well, regardless of a voltage level of the pad. A single protection transistor is sufficient to prevent current leakage through the parasitic PN diode.

3 Claims, 4 Drawing Sheets

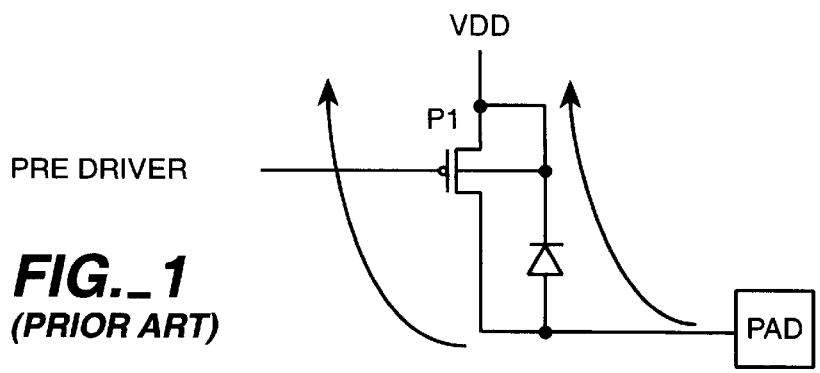
FIG._1
*(PRIOR ART)*
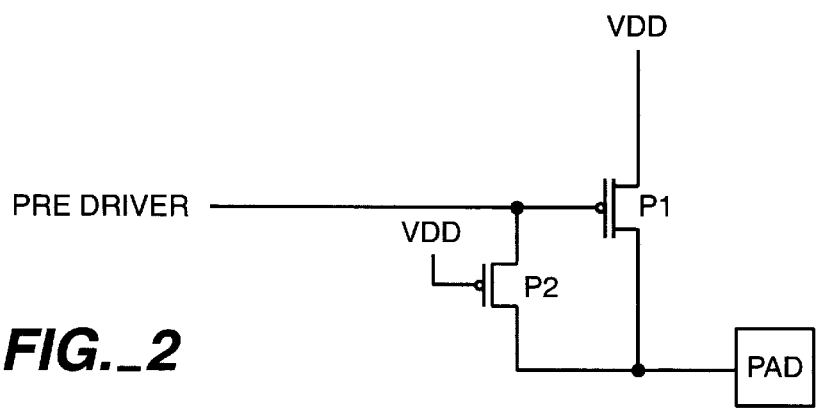
FIG._2
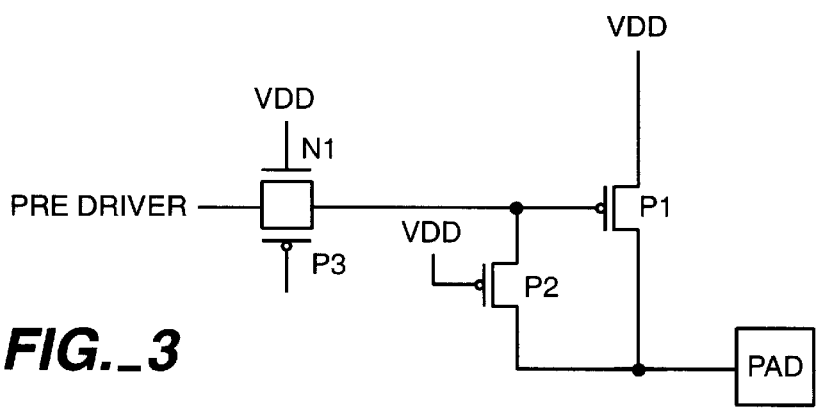
FIG._3
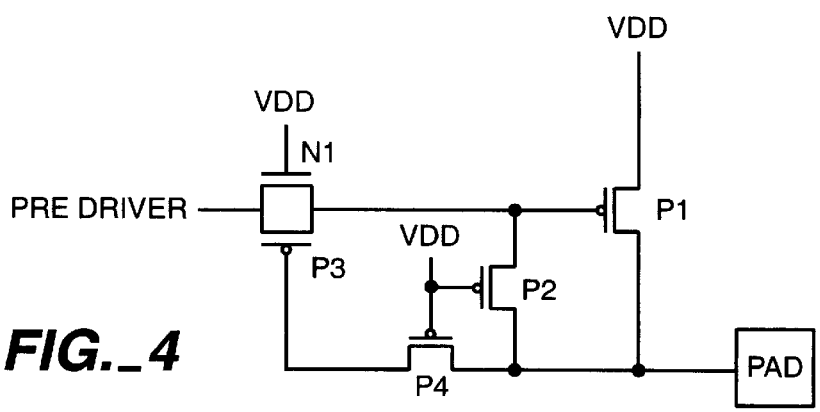
FIG._4

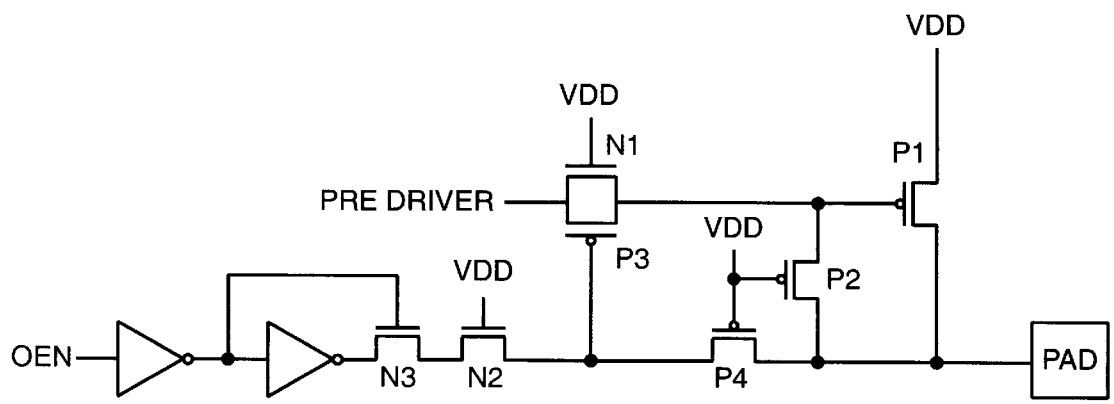
FIG._5
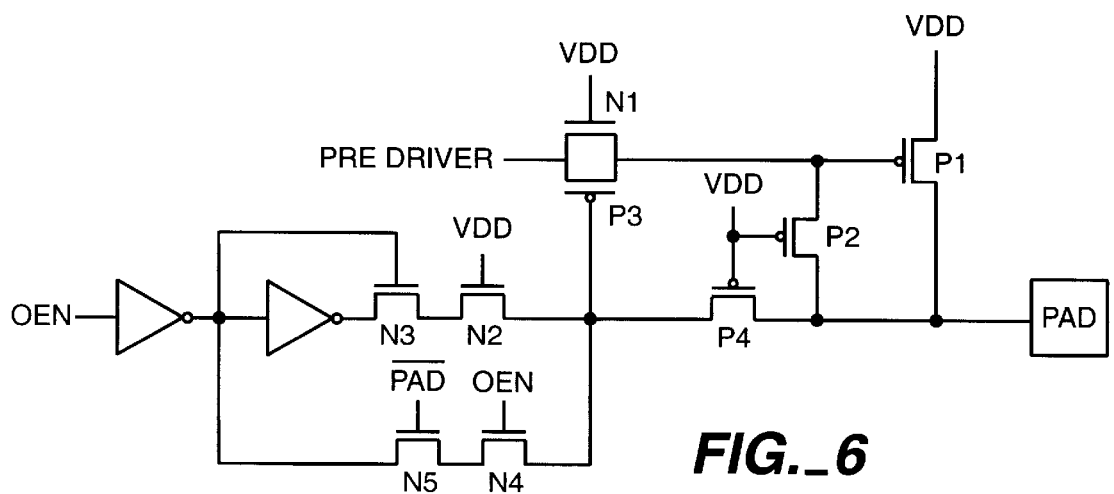
FIG._6
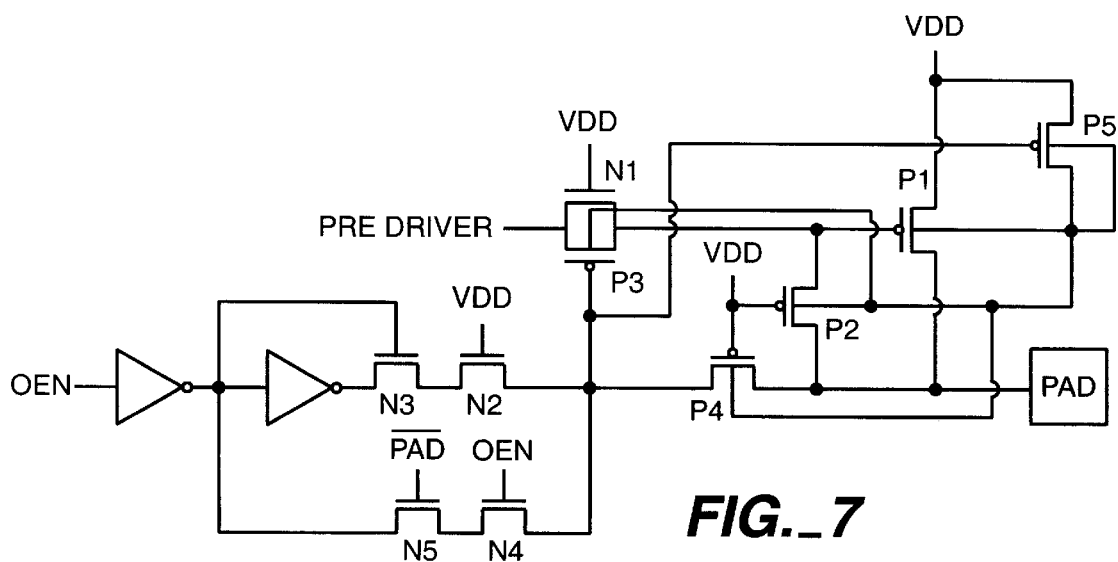
FIG._7

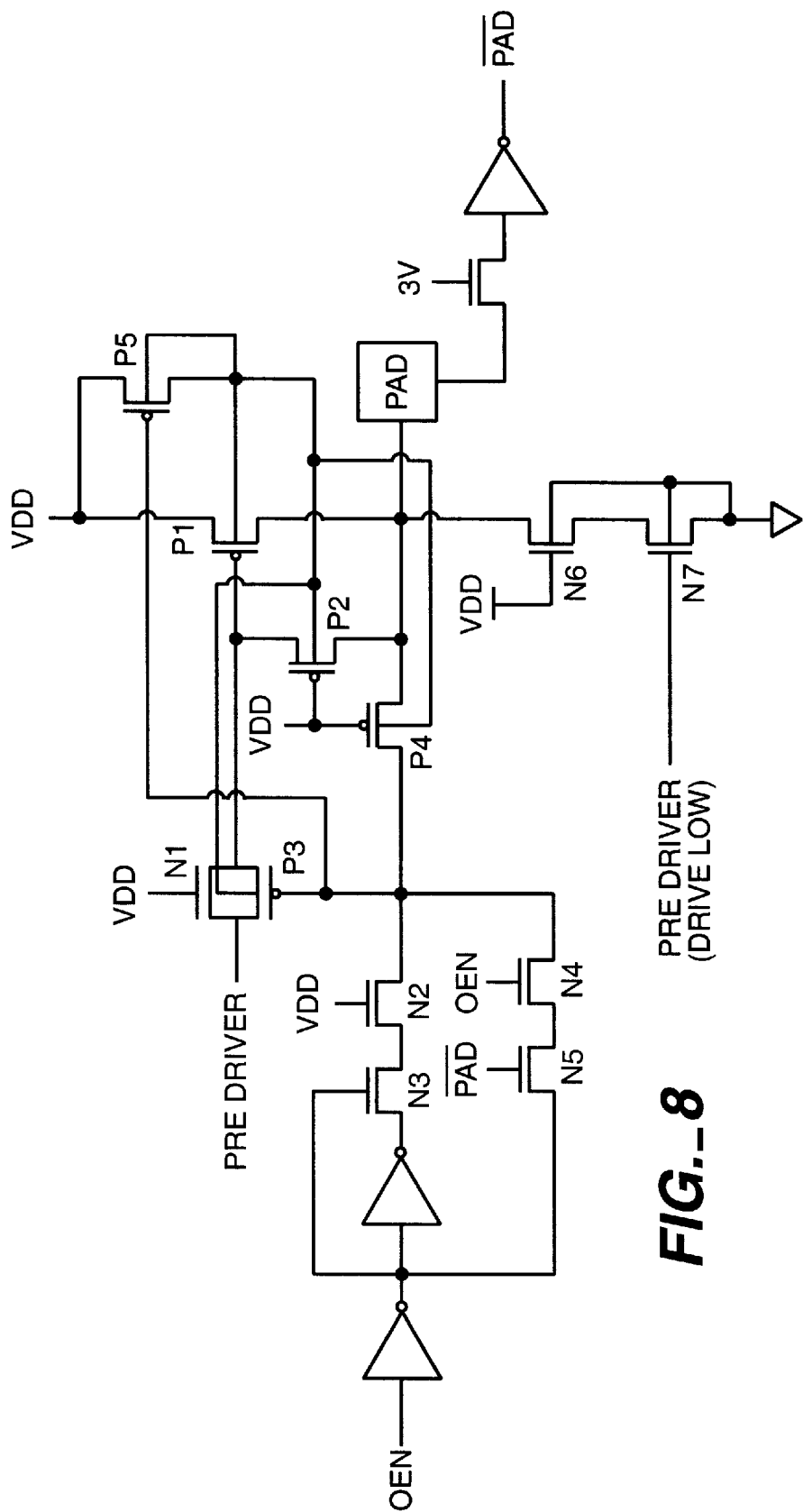
FIG._8

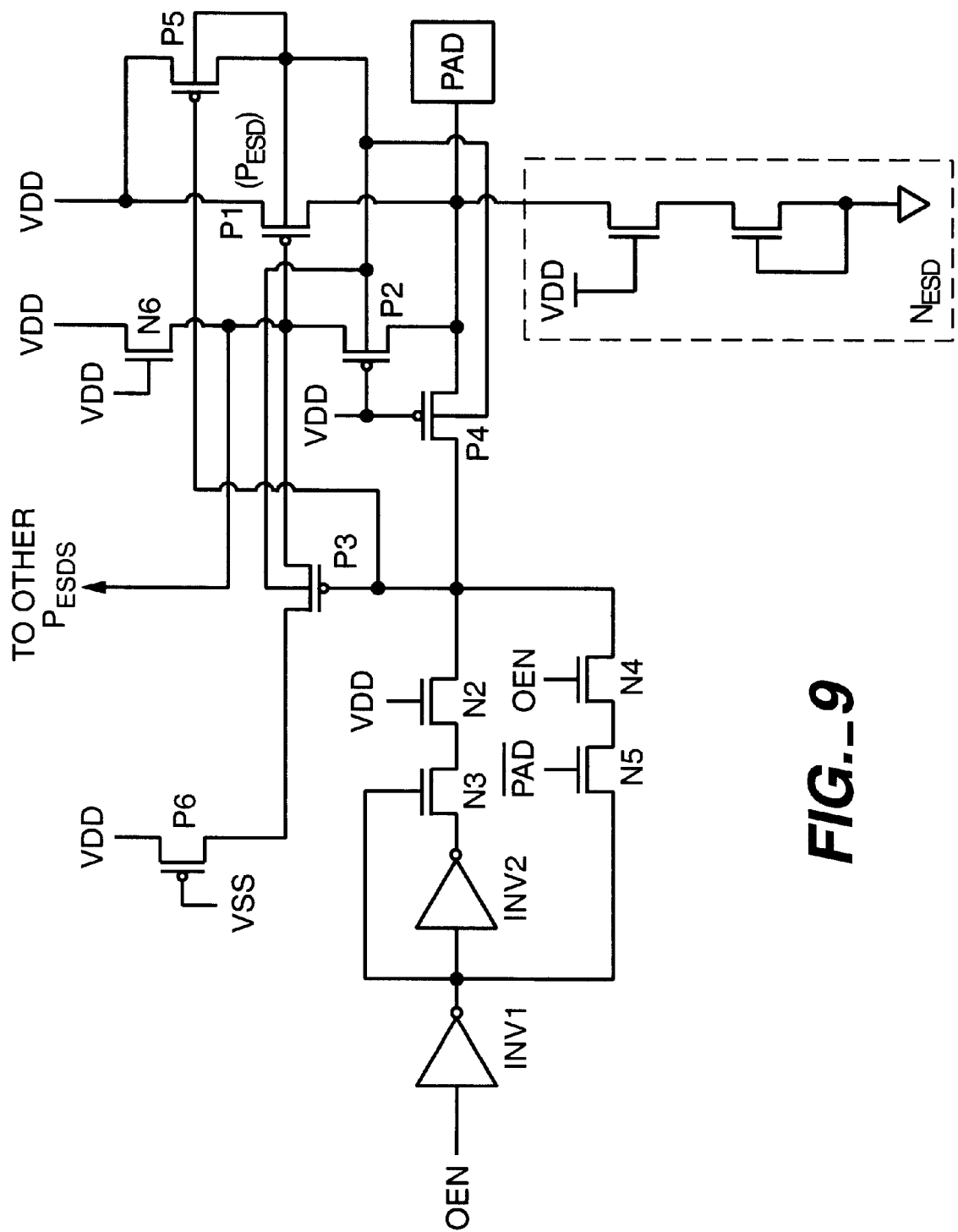
FIG._9

FIVE VOLT TOLERANT I/O BUFFER

BACKGROUND OF THE INVENTION

1. Field of the Invention

The present invention relates to I/O buffers for integrated circuits, and more particularly to a 5 volt tolerant I/O buffer, i.e., an I/O buffer to which 5 volts may be applied through a pad of the I/O buffer without adversely affecting circuit operation.

2. State of the Art

In integrated circuit technology, devices in different integrated circuit (IC) packages are interconnected to one another at I/O pads associated with each IC package. I/O pads are associated with electrical circuits which perform a desired function to interface with other IC packages or electrical devices. An I/O pad may be associated with electrical circuits which generate output signals and apply the signals to the I/O pad for external devices to sense and process accordingly. Alternatively, an I/O pad may be associated with electrical circuits which sense the logic state of signals applied to the I/O pad by external electrical circuits or IC packages. I/O pads are frequently "bidirectional" in the sense that they may be used at different times for the sensing of input signals to the IC package or for the application of output signals from the IC package. Electrical output signals are applied to an I/O pad via electrical circuits within the IC package associated with the I/O pad. Similarly, electrical input signals are received as input signals from an I/O pad by associated electrical circuits within the IC package which "sense" the signal level and operate accordingly.

It is common for such interconnected circuits to utilize standard voltage levels to represent logic states "0" and "1" (or "ON" and "OFF"). Common standard voltage levels in the past have been 0 volts (plus or minus a threshold value) to represent one logic state and 5 volts (plus or minus a threshold value) to represent the other logic state. As new IC manufacturing technologies evolve, the voltage levels used may change. For example, in the manufacture of many current IC devices using submicron semiconductor fabrication processes, the semiconductor industry has begun to standardize on 3 volt (more precisely, 3.3 volt, plus or minus a threshold value) in place of 5 volt signal levels to improve performance and reduce power dissipation. The lower voltage level permits reduced thickness in transistor gate oxide materials to thereby reduce switching time of transistor gates and improve performance of the switching circuitry.

Mixed mode operation occurs when circuits operating at 3 volts and 5 volts are coupled together. A simple example is described by coupling 3 and 5 volt digital logic circuits to a common bus. The logic circuits will typically have tristate buffers to avoid contention on the bus. Both 3 and 5 volt circuit types can read and write data to the bus but the magnitudes of the logic one levels of each will differ depending on the operating voltage. A problem with mixed mode operation is that a 3 volt tristate buffer may not be able to withstand a 5 volt signal without damaging itself or producing large leakage currents.

A standard tristate buffer design (for non-mixed mode operation) suffers from a high current drain problem at the drain of the P channel output device when the bus voltage exceeds its supply voltage. The bulk (N type region) of the P channel output device couples to the supply voltage of the tristate buffer (for example, 3 volts). The drain (P type) of the P channel output device couples to the bus. The PN diode formed by the bulk and drain becomes forward biased when the voltage on the bus reaches a diode drop above its supply voltage.

Referring to FIG. 1, consider an I/O buffer driven by a 3 volt power supply and connected to a bus which operates at 0 volts, 3 volts and 5 volts. when the I/O buffer is output disabled, the bond pad voltage can go up to 5 volts. In this condition, extra leakage current will flow from the bond pad to the 3 volt power supply. Two possible paths for this leakage current are shown in FIG. 1. To reduce the body effect of the transistor, the bulk voltage should be equal to the source voltage. Normally this is achieved by tying bulk to the source. In this case, current will leak into the source through the parasitic diode between the drain of the transistor P1 and bulk, whenever the voltage difference between the pad and VDD is more than a diode drop. The second current leak is through the transistor P1 itself. In the output disabled condition, the gate of P1 is at 3 volts. A 5 volt signal at the pad will turn the transistor P1 on, leaking current into VDD. In order to make the I/O buffer 5 volt tolerant, these two current paths should be blocked.

Various 5 volt tolerant I/O buffer circuits have been proposed. Examples of such circuits are described in U.S. Pat. No. 5,451,889 and U.S. Pat. No. 5,528,447, both of which are incorporated herein by reference. The proposed circuits are, in general, either unduly complicated or rely on logic that is pad driven during an output enabled state. In the latter instance, although steady state performance of the circuit may be acceptable, the circuit switches more slowly than is necessary.

SUMMARY OF THE INVENTION

The present invention, generally speaking, provides a 5 volt tolerant I/O buffer that overcomes the foregoing disadvantages. More particularly, in accordance with one embodiment of the invention, an I/O buffer circuit is coupled to a power supply terminal of a predetermined power supply voltage, for driving an I/O pad to a logic state depending on an input signal and an output enable signal. The I/O buffer circuit minimtnizes current flow into the power supply terminal when the pad is coupled to a voltage greater than the predetermined power supply voltage. A driver transistor of a first type is formed within a diffusion well and is coupled to the predetermined power supply voltage and to the pad. First and second terminals of a protection transistor are coupled to respective ones of the predetermined power supply voltage and the diffusion well. Circuitry is provided for, when the output enable signal is active, turning on the protection transistor so as to couple the predetermined power supply voltage to the diffusion well, regardless of a voltage level of the pad. Hence, in accordance with one feature of the invention, a single protection transistor is sufficient to prevent current leakage through the parasitic PN diode.

BRIEF DESCRIPTION OF THE DRAWING

The present invention may be further understood from the following description in conjunction with the appended drawing. In the drawing:

FIG. 1 is a diagram of a P driver portion of an I/O buffer, showing two current leakage paths that occur when the pad voltage is 5 volts;

FIG. 2 is a diagram of the P driver of FIG. 1 showing the addition of a transistor used to supply the pad voltage to the gate of the P driver to turn it off when the pad voltage is 5 volts;

FIG. 3 is a diagram of the P driver of FIG. 2 wherein a passgate is used to isolate the 5 volt gate voltage of the P driver from a predriver portion of the I/O buffer circuit;

FIG. 4 is a diagram of the P driver circuit of FIG. 3 wherein a transistor supplies the pad voltage to the gate of a P transistor of the transmission gate to turn it off when the pad is at 5 volts;

FIG. 5 is a diagram of the P driver circuit of FIG. 4 wherein logic is provided to cause the P transistor of the pass gate to pass 3 volts to the gate of the P driver when an output enable signal is active;

FIG. 6 is a diagram of the P driver circuit of FIG. 5 wherein additional logic is provided to prevent leakage current from VDD to the pad when the pad is at 0 volts and the output enable signal is inactive;

FIG. 7 is a diagram of the P driver circuit of FIG. 6 wherein a single P transistor has been added to block the leakage path to VDD when the pad is at 5 volts;

FIG. 8 is a diagram of the complete I/O buffer circuit of the present invention, including the P driver of FIG. 7 and an N driver; and FIG. 9 is a diagram of a protection circuit used to protect P drivers within an I/O circuit that are connected to provide ESD protection but that do not drive the I/O pad.

DETAILED DESCRIPTION OF THE PREFERRED EMBODIMENTS

The following detailed description relates to an exemplary embodiment of the present invention. In the exemplary embodiment, an I/O buffer is made to be 5 volt tolerant. It should be understood, however, that the particular voltage levels described are of no special consequence. The invention is applicable whenever an I/O pad may be driven by an external device to a higher voltage level than that to which it is driven by the I/O buffer.

Fundamentally, to make an I/O buffer 5 volt tolerant, the P driver of the I/O buffer should always be in cutoff mode when the output enable signal is inactive. Referring to FIG. 1, when the pad is at 5 volts, if the gate of the P driver P1 is at 3 volts or less, then the transistor P1 will be turned on, contrary to the foregoing objective. Therefore, when the pad is at 5 volts, the gate of the transistor P1 should be at 5 volts also. To achieve this purpose, a P transistor P2 is added as shown in FIG. 2. As a consequence, when the pad is at 5 volts, the transistor P2 will turn on such that the gate of the transistor P1 will also be at 5 volts. In this manner, the transistor P1 is assured to be in cutoff mode.

The 5 volt potential at the gate of the transistor P1 should be isolated from predriver logic. For this purpose, a pass gate is used as shown in FIG. 3. The transistors N1 and P3 form a passgate which will pass a 0 volt or a 3 volt signal to the gate of the transistor P1. As previously described, however, when the output enable signal is inactive and 5 volts is present at the pad, 5 volts will also be present at the gate of the transistor P1 (since the transistor P2 will turn on). In order to block leakage into the predriver whenever there is 5 volts at the gate of the transistor P1, the transistor P3 should likewise have 5 volts at its gate. To this end, a P transistor P4 is added between the pad and the gate of the transistor P3 as shown in FIG. 4. The transistor P4 will behave in like manner as the transistor P2 and will pass 5 volts to the gate of the transistor P3 when the pad is at 5 volts.

When the output enable signal is active low, the transistor P3 should pass 3 volts across the passgate to the gate of the transistor P1. This manner of operation is achieved as shown in FIG. 5. The output enable signal is input to a pair of series connected inverters. The output of the inverter is input to a pair of series connected N type transistors. The gate of the transistor N3 is connected to an intermediate node between the two inverters. Hence, when the output enable signal is active low, the transistor N3 will be turned on. The gate of the transistor N2 is connected to VDD such that the transistor N2 is always turned on. The output of the two series connected N type transistors is connected to the gate of the transistor P3.

Now, when the output enable signal is active low, the transistors N2 and N3 will pass 0 volts to the gate of the transistor P3, which will remain on for so long as the output enable signal remains active. As described above, the gate of the transistor P3 will be at 5 volts when the pad is at 5 volts. The transistor N2 is therefore used to reduce voltage stress at the gate oxide of the transistor N3.

When the output enable signal is inactive, the pad may be driven by an external device to any of three possible voltage levels: 0 volts, 3 volts or 5 volts. When the pad is at 0 volts, the transistor P1 should be placed in cutoff mode to prevent current leakage from VDD to the pad. For this purpose, additional logic is added to the circuit of FIG. 5 as shown in FIG. 6. In particular, the intermediate node between the two inverters is coupled to the gate of the transistor P3 through another pair of series connected N type transistors N5 and N4. The gate of the transistor N5 is connected to the logical inverse of the level-shifted pad voltage. The gate of the transistor N4 is connected to the output enable signal. When the pad is at 0 volts, the transistors N5 and N4 will be on and the gate of the transistor P3 will be at 0 volts, which will pass 3 volts to the gate of the transistor P1, turning it off.

The behavior of selected nodes in the circuit of FIG. 6 is set forth in Table 1.

TABLE 1

Behavior of circuit during different PAD voltages

| I/O buffer mode | PAD | OEN | Gate of P1 | Gate of P3 | State of different transistors |
|---|---|---|---|---|---|
| enabled | 0V | 0V | 3V | 0V | N2, N3, N1, N5 & P3 are ON P2, P4, P1 & N4 are OFF |
| enabled | 3V | 0V | 0V | 0V | N2, N3, N1, P3 & P1 are ON P2, P4, N4 & N5 are OFF |
| disabled | 0V | 3V | 3V | 0V | N2, N4, N5, N1 & P3 are ON N3, P2, P4 & P1 are OFF |
| disabled | 3V | 3V | 3-$V_{TN1}$* | floating | N2, N1 & N4 are ON N3, N5, P2 & P4 are OFF |
| disabled | 5V | 3V | 5V | 5V | N2, N4, N1, P2 & P4 are ON N3, N5, P3 & P1 are OFF |

*At this condition behavior of P1 depends on $V_{TN1}$ -- P1 could be in active mode but no harm results since both source and drain are same potential of 3V resulting in very little leakage current.

Note that in the fourth condition of Table 1 (the pad is at 3 volts and the output enable signal is inactive high at 3 volts) the transistor P3 will be off such that the gate voltage of the transistor P1 will be $3V-V_{PN1}$. This voltage may cause the transistor P1 to enter the active mode, but there will be no leakage current through the transistor P1, since the pad and VDD are both at 3 volts.

The foregoing discussion has focused only on the leakage path through the transistor P1. The other leakage path is through the bulk. This leakage path may be blocked using further circuitry as shown in FIG. 7. A P transistor P5 is coupled between the supply voltage VDD and the N well in which each of the P transistors is formed. The gate of the transistor P5 is coupled to the gate of the transistor P3. Now, the N well is pulled up to VDD as required via the transistor P5. The transistors P1, P2, P3, P4 and P5 are all in the same N well, which is pulled up by the transistor P5. Since the gate of the transistor P5 is coupled to the gate of the transistor P3, the transistor P5 will be on whenever the transistor P3 is on, as described in Table 2.

TABLE 2

N well voltage at different PAD voltages

| OEN | PAD | P5 Mode | N well voltage |
|---|---|---|---|
| 0V | 0V | ON | VDD |
| 0V | 3V | ON | VDD |
| 3V | 0V | ON | VDD |
| 3V | 3V | gate is floating | 3-Vd ≦ well ≦ VDD |
| 3V | 5V | OFF | 5-Vd |

Vd is the parasitic diode voltage drop.

The complete I/O buffer circuit including N driver pull-down circuitry is shown in FIG. 8. Series-connected N type transistors N6 and N7 are coupled from pad to ground. The gate of transistor N6 is connected to VDD, and the gate of transistor N7 is connected to pre-driver circuitry. The transistor N6 provides voltage stress protection for the transistor N7. Unlike some proposed 5 V tolerant I/O buffer circuits, no connection is made to the intermediate node between the transistors N6 and N7. Such connections present process difficulties that are avoided in the present design.

ESD protection is provided by large output buffer devices breaking down when a large voltage is applied across their source and drain. If the devices are too small they may be destroyed. Thus, when the output buffer device is small, an additional ESD protection device is added to share the burden of discharging the ESD pulse with the output buffer.

In a standard I/O buffer, there will typically be provided some number of P drivers and some number of N drivers. Different numbers of drivers are used to create I/O pads of different drive strengths. In low drive strength I/O pads, the unused P drivers are used for ESD protection by connecting their gates to the source voltage. The drains of the unused P drivers are connected to the pad. Therefore, these P drivers should be 5 volt tolerant just as the active P drivers. Unused N drivers are also used for ESD protection (see FIG. 9) but do not require any special measures for 5 volt tolerance.

In FIG. 9, the transistor P1 is assumed to be unused but is nevertheless connected to the pad to provide ESD protection. The gate of the transistor P1 is connected to VDD through the transistor N6, and is also connected to VDD through the transistor P5 when the transistor P3 is on. The output enable logic circuitry including the inverter INV1, the inverter INV2, and the transistors N3, N2, N5, N4 and P4 may be shared with the 5 volt tolerant circuit of the driver transistor. The transistors P2, N6 and P6, which do not appear in the 5 volt tolerant circuit of the driver transistor, are added for this circuit only. Also, the pass transistor P3 is separate from the driver pass transistor.

The behavior of the circuit of FIG. 8 is given in Table 3.

TABLE 3

Behavior of ESD protection device 5V tolerant circuit

| I/O buffer mode | PAD | OEN | Gate of P1 | Gate of P3 | State of different transistors |
|---|---|---|---|---|---|
| enabled | 0V | 0V | 3V | 0V | N2, N3, N6, N5, P3 & P5 are ON P2, P4, P1 & N4 are OFF |
| enabled | 3V | 0V | 0V | 0V | N2, N3, N6, P3 & P5 are ON P2, P4, N4, N5 & P1 are OFF |
| disabled | 0V | 3V | 3V | 0V | N2, N4, N5, N6, P3 & P5 are ON N3, P2, P4 & P1 are OFF |
| disabled | 3V | 3V | 3-V$_{TN1}$. | floating | N2, P5 & N6 are ON N3, N5, P2 & P4 are OFF |
| disabled | 5V | 3V | 5V | 5V | N2, N4, N6, P2, P5 & P4 are ON N3, N5, P3 & P1 are OFF |

It will be appreciated by those of ordinary skill in the art that the present invention may be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A tri-state CMOS I/O buffer circuit having overvoltage protection, comprising:
   a PMOS driver transistor coupled to a supply voltage and to an I/O pad;
   a transmission gate including an NMOS transistor and a PMOS transistor connected in parallel, coupled to a gate electrode of the driver transistor, for passing voltages representing both high and low logic levels through the transmission gate in a first direction to the gate electrode of the driver transistor, and for blocking an overvoltage level from passing from the gate electrode of the driver transistor in a second direction opposite the first direction;
   control logic coupled to a gate electrode of the PMOS transistor, comprising first logic for controlling a conductive state of the PMOS transistor during an output enabled condition, and second logic for controlling a conductive state of the PMOS transistor during an output disabled condition, wherein each of the first control logic and the second control logic comprises multiple series-connected NMOS transistors; and
   a first PMOS protection transistor coupled between the pad and the gate electrode of the driver transistor for, when a pad voltage level exceeds the supply voltage, applying the pad voltage to the gate electrode of the driver transistor.

2. The apparatus of claim 1, further comprising a second PMOS protection transistor coupled between the pad and the gate electrode of the PMOS transistor of the transmission gate.

3. The apparatus of claim 2, wherein all of said PMOS transistors are formed within a common diffusion well, further comprising a third PMOS protection transistor formed within the diffusion well and coupled between said supply voltage and the diffusion well, the third PMOS protection transistor being controlled by said control logic.

* * * * *